United States Patent [19]

Tobin

[11] Patent Number: 4,819,040

[45] Date of Patent: Apr. 4, 1989

[54] EPITAXIAL CMOS BY OXYGEN IMPLANTATION

[75] Inventor: Philip J. Tobin, Austin, Tex.

[73] Assignee: Motorola, Inc., Schaumburg, Ill.

[21] Appl. No.: 243,208

[22] Filed: Sep. 9, 1988

Related U.S. Application Data

[63] Continuation of Ser. No. 858,782, May 2, 1986, abandoned.

[51] Int. Cl.[4] .................. H01L 27/02; H01L 27/04; H01L 29/167
[52] U.S. Cl. .................................. 357/42; 357/50; 357/63; 357/91; 437/24
[58] Field of Search .................. 357/42, 50, 63, 64, 357/91

[56] References Cited

U.S. PATENT DOCUMENTS 4,082,571 4/1978 Graul et al. .................. 357/50
4,689,667 8/1987 Aronowitz .................. 357/63

FOREIGN PATENT DOCUMENTS 56-21366 2/1981 Japan .................. 357/64

Primary Examiner—Gene M. Munson
Attorney, Agent, or Firm—John A. Fisher

[57] ABSTRACT

A technique for selectively implanting regions of semiconductor crystals with oxygen to increase their yield strength. This intentional, selective oxygen pinning technique is especially useful in causing underlying, originally oxygen-free silicon to be more resistant to plastic deformation during isolation field oxide formation processes. Oxide regions grown on a substrate cause stress at the oxide/substrate interface and typically dislocation and other stress induced crystallographic defects at and near the point of stress, especially if the substrate is essentially oxygen-free. Dislocation and other crystallographic defects that occur in the areas of device formation and p/n junctions can cause junction leakage and active device degradation.

6 Claims, 2 Drawing Sheets

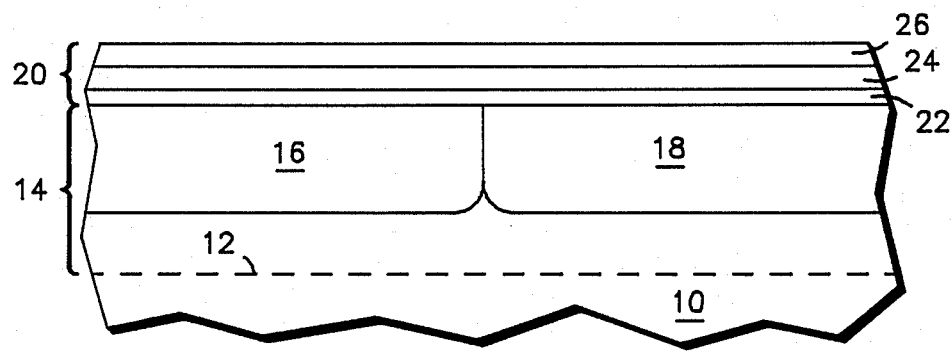
FIG. 1
FIG. 2
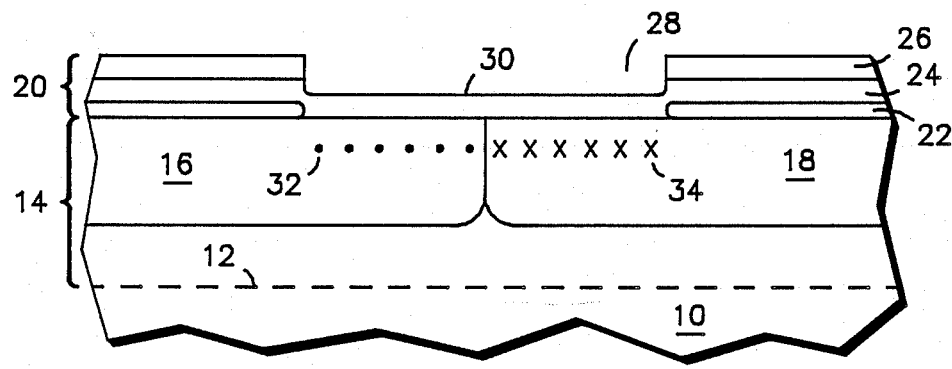

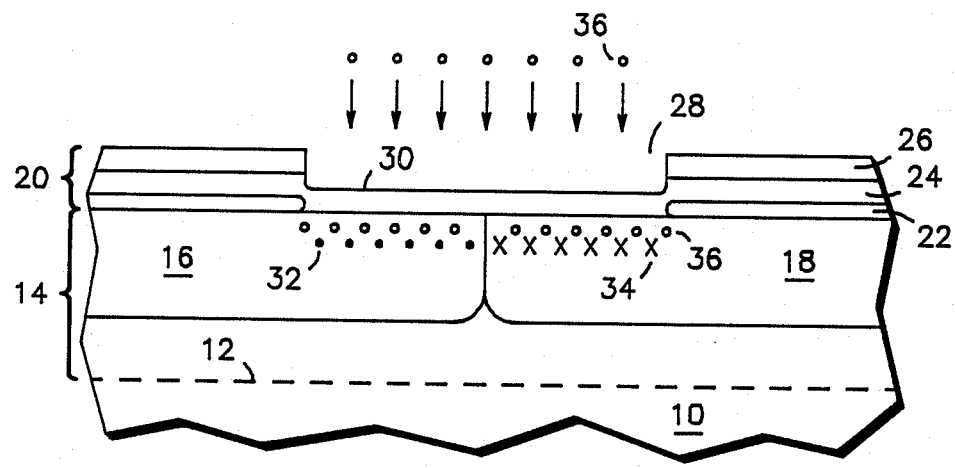
FIG. 3
FIG. 4
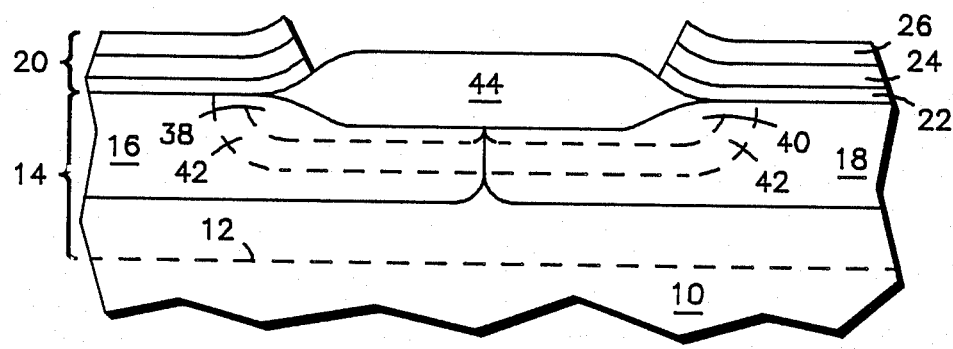

EPITAXIAL CMOS BY OXYGEN IMPLANTATION

This application is a continuation, of application Ser. No. 858,782, filed 05/02/86, now abandoned.

FIELD OF THE INVENTION

The invention relates to integrated circuit structures fabricated upon semiconductor wafers and more particularly relates to integrated circuit structures having implantation enhanced regions with improved properties and methods for making such regions

BACKGROUND OF THE INVENTION

In the fabrication of integrated circuits upon semiconductor substrates, highly miniaturized electronic devices are formed by patterning layers of various materials upon each other. In many instances these layers or portions of layers are grown upon existing layers of material or the substrate itself and a particular concern is the stresses that build up at the interface of the layers when one is grown or deposited upon another.

In many isolation schemes used to isolate devices from one another, such as local oxidation of silicon (LOCOS), sealed interface local oxidation (SILO), etc., the oxidation masking layers such as $Si_3N_4$ on top of $SiO_2$, which is used for LOCOS, together with the volume expansion of the field oxidation being grown can induce mechanical stresses in the underlying silicon which exceed its elastic limit and thereby create dislocations and other crystallographic defects. In fact, the stress has been shown to be highest at the edge of the masking structure, see K. Shibata, et al. "Generation Mechanism of Dislocations in Local Oxidation of Silicon," *J. Electrochem. Soc.*, Vol. 127, No. 6, 1980, pp. 1383–1387 and C. Claeys, et al. "Defect Control in $Si_3N_4/SiO_2$ Structures for Isolation Techniques", paper publication 1984, pp. 272–287. If these defects occur at or near a p/n junction, junction leakage may occur and device degradation will result. Investigations into eliminating these problems have determined that the oxygen concentration of the silicon wafer is important in determining its resistance to plastic deformation during events such as field oxide growth.

In epitaxial layers, which are grown or deposited on the surface of a semiconductor wafer, the resistance to plastic deformation is less than that of typical Czochralski silicon wafers because the epitaxial (epi) layers are essentially oxygen-free. For example, in one study of the micro-hardness of epitaxial v. non-epitaxial wafers, the non-epitaxial wafers were measured as being appreciably harder. The numbers shown below are based on measurements of essentially how deep into the surface a standard indentation probe penetrated, factored into a calculation such that the smaller the result, the softer the surface (Knoop hardness).

TABLE I

Hardness Measurements
(average of ten readings each)

| | Knoop Hardness Index |
|---|---|
| 1. 14 micron (μm) thick p⁻ epi of 14–22 ohm-cm resistivity on p⁺ wafer of 0.01–0.02 ohm-cm resistivity | 769 |
| 2. p⁻ wafer of 14–22 ohm-cm resistivity and nominally 28 ppm oxygen | 854 |

This data leads to the speculation that junction leakage resulting from silicon defects could be more severe when fabricated in epitaxial layers than bulk silicon.

SUMMARY OF THE INVENTION

Accordingly, it is an object of the present invention to provide a method for minimizing the occurrence of dislocations and other stress induced crystalographic defects in silicon when the silicon is subjected to stress.

Another object of the present invention is to accomplish the above goal by increasing the yield strength of the silicon.

Yet another object of the present invention is to provide isolation structures having a minimum of stress induced crystallographic defects in the silicon upon which they are grown.

It is another object of the present invention to provide isolation structures having a minimum of stress induced crystallographic defects in the silicon beneath them without requiring an extra mask step or special equipment.

In carrying out these and other objects of the invention, there is provided, in one form, an integrated circuit built upon an essentially oxygen-free semiconductor surface made by first providing an essentially oxygen-free semiconductor surface and selectively distributing oxygen into a plurality of exposed areas of the semiconductor surface to form a plurality of oxygen diffused regions.

BRIEF DESCRIPTION OF THE DRAWINGS

FIG. 1 is a cross-section illustration of a semiconductor wafer having a epitaxial layer and a layer of isolation formation inhibiting material formed thereon in preparation for the fabrication of an isolation region;

FIG. 2 is a cross-section illustration of the semiconductor wafer of FIG. 1 wherein a selective portion of the isolation formation inhibiting material has been removed and optional channel stop impurities have been implanted;

FIG. 3 is a cross-section illustration of the semiconductor wafer of FIG. 2 showing the oxygen implantation step; and FIG. 4 is a cross-section illustration of the semiconductor wafer of FIG. 3 after the isolation region has been grown and the channel stop and oxygen regions have been driven in.

DETAILED DESCRIPTION OF THE INVENTION

It has been discovered that a remedy to the problems noted above involves selectively implanting oxygen into the epitaxial layer to raise its yield strength. According to Hu, "Dislocation Pinning Effect of Oxygen Atoms in Silicon," *Appl. Phys. Lett.*, Vol. 31, No. 2, 15 July 1977, pp. 53–55, dislocation pinning ceases at oxygen concentrations equal to or below $2 \times 10^{17}$ atoms $cm^3$ with strengthening of the silicon crystal increasing up to about $7.5 \times 10^{17}$ atoms/$cm^3$. However, Hu is concerned exclusively with original, silicon crystals grown by various processes having differing oxygen contents. No mention is made of the selective distribution of oxygen. In order to achieve these concentrations, doses in the range of about $10^{14}$ to $10^{15}$ atoms/$cm^2$ at energies of about 40 to 100 KeV are suggested, but should not be considered as limiting the scope of the invention.

Integration of the concept of selective implantation of oxygen to increase the yield strength of silicon into a sealed interface local oxidation (SILO) isolated twin well epitaxial CMOS process is herein described with reference to the Figures. The method of this invention could also be incorporated into other known isolation formation processes, or into any process where an overlying layer causes undesirable stress in the underlying monocrystalline semiconductor substrate. It should be noted that the Figures are not to scale or proportion, being especially exaggerated in the vertical dimension, for the purpose of clear illustration. Shown in FIG. 1 is a semiconductor wafer 10 having a surface 12 upon which an epitaxial layer 14 has been grown or otherwise formed. Two wells of opposite impurity type, lightly doped p— well 16 and lightly doped n— well 18 have been formed in selected adjacent positions in the surface of epitaxial layer 14, and an oxidation inhibition layer or sandwich NON (silicon nitride/silicon oxide/silicon nitride) layer 20 composed of a layer of thermal nitride $Si_3N_4$ 22, a middle layer of low temperature oxide (LTO) and low pressure chemical vapor deposited (LPCVD) nitride 26 has been formed on the top surface of epi layer 14.

It should be noted that the invention does not have to be implemented in a twin well substrate but may be used in any situation where the underlying silicon must be made more resistant to plastic deformation. This invention is therefore particularly important for epitaxial structures since epitaxial layers are essentially oxygen free. Also, oxidation inhibition layer 20 need not be an NON structure, for example, silicon nitride only, in its various forms, may be employed for this layer. Even if a NON layer 20 is used, the nitride layers 22 and 26 and oxide layer 24 need not be formed by the specific processes indicated. These processes are specified only for the purposes of illustration and are not intended to limit the scope of the invention.

Next, as shown in FIG. 2, the oxidation inhibition layer 20 is patterned via conventional photolithographic techniques to give an opening or exposed area 28 where the field isolation oxide region is to be grown. A relatively thin layer of pad oxide 30 is grown or otherwise formed to permit ion implantation without contamination of the silicon. By means of various photoresist patterns or other methods, the silicon beneath the opening 28 is implanted with boron impurities 32 and phosphorus impurities 34, on opposite sides of the twin well interface indicated by the dots and Xs respectively, to eventually provide p-conductivity and n-conductivity channel stops. Some alternate embodiments use a well oxidation step in between the implants, and the channel doping concentrations will have to be adjusted for this intermediate step(s). In some methods, patterned oxide inhibition layer 20 may be used as a partial mask for these implants. Again, the invention is not limited by the presence of these implants and is unaffected thereby.

Shown in FIG. 3 is the oxygen implantation step, the oxygen impurities 36 being represented by small circles and being implanted only into the silicon not covered by the NON oxygen blocking layer 20 which serves as a mask in this step. The oxygen implant, as the boron and phosphorus implants conducted above, only forms a very shallow, but very concentrated area of impurity.

Next a drive-in step is performed by which the boron, phosphorus and oxygen impurities are driven down to their desired depth, to form p channel stop 38, n channel stop 40 and oxygen diffused region 42. The isolation field oxide region 44 may be formed simultaneously with or subsequent to this thermal drive-in step. What is important is that the oxygen is present in the silicon during the isolation field oxide 44 growth to provide greater field strength to the underlying silicon and prevent dislocations and other stress induced crystallographic defects in the area of the isolation oxide region 44 and in surrounding areas which may ultimately have devices formed therein. Note that the implanted oxygen impurities have diffused farther than the boron and phosphorus impurities since it diffuses at a faster rate than boron and phosphorus during the thermal drive-in step. This property is critical in forming oxygen diffused region 42 large enough to have the desired beneficial effects. The oxygen diffused region 42 may travel downward far enough to "punch through" a well, but for isolation structures, this is not an undesirable phenomenon.

To reduce the possibility that boron-oxygen and phosphorus-oxygen clusters will form after all of the impurities 32, 34 and 36 are shallowly implanted, and thus remove the boron 32 and oxygen 34 impurities from the impurities having good electrical activities, a brief inert anneal at an elevated temperature before the oxygen implant may be required or desirable. For example, this brief, inert anneal may be conducted at a temperature of about 900° C.

The field oxidation cycle may be, for example only, conducted at 1000° C. for 100 to 120 minutes in steam depending on the desired thickness, which may be around 6000 to 9000 Angstroms.

According to the Shibata and Claeys articles, already mentioned, stress is highest at the edge of the masking structure, i.e. oxidation inhibition layer 20. Dislocation motion and multiplication will occur when the critically resolved shear stress, $\tau_c$ is exceeded. The critically resolved shear stress is that stress acting in the weakest plane of the crystal structure which will generate and/or move dislocations even if the stress is applied in some other plane and only a component of the stress acts in the crystal plane most likely to fail. According to the Hu article, increases of up to 4× of $\tau_c$ are achieved as a result of dislocation pinning by oxygen atoms present during silicon wafer formation. The benefits will be manifested as a reduction in leakage of junctions fabricated in the active area, i.e. p+n and n+p junctions for source/drain regions for CMOS integrated circuits. The technique described can be used beneficially for any epi CMOS technology where the isolation scheme generates stresses in the silicon active area which could generate defects, such as SILO, LOCOS and other field oxidation techniques. The technique may also be used for any essentially oxygen-free monocrystalline semiconductor substrate upon which a layer will be formed which will induce stress into the semiconductor substrate.

I claim:

1. An integrated circuit structure comprising:
    a monocrystalline silicon substrate;
    an epitaxial layer overlying said substrate;
    a first N-type region and a second P-type region located at the surface of said epitaxial layer and forming a PN junction therebetween;
    a localized thick field oxide region overlying said PN junction and recessed into the surface of said substrate;
    a localized region of ion implanted oxygen aligned with and underlying said thick field oxide region.

2. A CMOS integrated circuit device comprising:

a silicon substrate having a surface;
a first N-type region of first dopant concentration formed at said surface;
a second P-type region dopant concentration formed at said surface, said first region and said second region forming a PN junction therebetween;
a thick field oxide overlying said PN junction and partially recessed into said surface;
a third N-type region formed in said first N-type region, underlying said thick field oxide, and having a dopant concentration greater than said first dopant concentration;
a fourth P-type region formed in said second P-type region, underlying said thick field oxide, and having a dopant concentration greater than said second dopant concentration;
and a fifth region of ion implanted oxygen underlying said third and fourth regions and underlying and self aligned with said thick field oxide.

3. The CMOS integrated circuit device of claim 2 wherein said silicon substrate comprises a monocrystalline silicon substrate having an epitaxial layer thereon.

4. An integrated circuit structure comprising:
a silicon substrate having a surface;
a silicon nitride layer overlying said surface and having an opening therethrough exposing a portion of said surface;
a field oxide formed at and partially recessed into said surface, said field oxide within and aligned with said opening;
and a region in said silicon substrate underlying and aligned with said field oxide, said region having a predetermined concentration of ion implanted oxygen.

5. The integrated circuit structure of claim 4 wherein said silicon substrate comprises an epitaxial layer.

6. The integrated circuit structure of claim 4 wherein said silicon substrate comprises a surface region of predetermined conductivity type and first dopant concentration and wherein said structure further comprises a doped region of said predetermined conductivity type and second dopant concentration greater than said first dopant concentration underlying and aligned with said field oxide.

* * * * *